US010303809B2

(12) United States Patent
Banta et al.

(10) Patent No.: US 10,303,809 B2
(45) Date of Patent: May 28, 2019

(54) AUTOMATIC CREATION OF FASTENERS FOR SIMULATING A COMPUTER-AIDED DESIGN (CAD) MODEL

(71) Applicant: Dassault Systemes SolidWorks Corporation, Waltham, MA (US)

(72) Inventors: Marlon Robert Leon Banta, Arlington, MA (US); Li-Ling Huang, West Covina, CA (US); Subbi Reddy Chirla, Maharashtra (IN)

(73) Assignee: Dassault Systemes SolidWorks Corporation, Waltham, MA (US)

( * ) Notice: Subject to any disclaimer, the term of this patent is extended or adjusted under 35 U.S.C. 154(b) by 813 days.

(21) Appl. No.: 14/311,201

(22) Filed: Jun. 20, 2014

(65) Prior Publication Data

US 2014/0379309 A1 Dec. 25, 2014

Related U.S. Application Data

(60) Provisional application No. 61/838,162, filed on Jun. 21, 2013.

(51) Int. Cl.
*G06F 17/50* (2006.01)
(52) U.S. Cl.
CPC .......... *G06F 17/50* (2013.01); *G06F 17/5018* (2013.01); *G06F 17/5086* (2013.01)
(58) Field of Classification Search
CPC ... G06F 17/50; G06F 17/5086; G06F 17/5018
See application file for complete search history.

(56) References Cited

U.S. PATENT DOCUMENTS 4,918,627 A * 4/1990 Garcia .................... G06T 7/001
 348/92
6,904,395 B1 * 6/2005 DeJack ............... G06F 17/5095
 703/7

(Continued)

FOREIGN PATENT DOCUMENTS

JP 2001-265836 9/2001
JP 2011-238008 11/2011

OTHER PUBLICATIONS

Kinney, Paul et al., "Three Dimensional Threaded Fastener Meshing Algorithm", 2001, Solid Modeling 01, ACM. (Year: 2001).*
Kim, Jeong et al., "Finite Element Analysis and Modeling of Structure with Bolted Joints", Jul. 25, 2006, Applied Mathematical Modeling 31, Elsevier, Inc. (Year: 2006).*

(Continued)

*Primary Examiner* — Cedric Johnson
(74) *Attorney, Agent, or Firm* — Hamilton, Brook, Smith & Reynolds, P.C.

(57) ABSTRACT

A computer-implemented method and system automatically creates data for use by a computer-aided simulation process. The method and system determine that a CAD model component represents a real-world object that is a fastener. The method and system automatically analyze the CAD component and derive properties for use by the simulation process. The derived properties include size data, location data, and material type data. The method and system automatically calculate a zone of influence of the CAD component on another CAD component. The simulation process utilizes at least one of the properties to calculate the zone of influence to simulate a real-world assembly of which the fastener is a component.

20 Claims, 5 Drawing Sheets
(4 of 5 Drawing Sheet(s) Filed in Color)

(56) References Cited

U.S. PATENT DOCUMENTS

| | | | |
|---|---|---|---|
| 7,110,922 B2 | 9/2006 | Onodera et al. | |
| 7,499,845 B1* | 3/2009 | Quincy | G06F 17/5018 703/7 |
| 8,244,507 B2* | 8/2012 | Hollingshead | G06F 17/5004 703/7 |
| 2001/0034590 A1* | 10/2001 | Onodera | G06F 17/10 703/2 |
| 2002/0107673 A1* | 8/2002 | Haller | G05B 19/41805 703/1 |
| 2007/0011496 A1* | 1/2007 | Ahmad | G06F 17/50 714/39 |
| 2008/0052053 A1* | 2/2008 | Yoshihara | G06F 17/50 703/6 |
| 2008/0111813 A1* | 5/2008 | Gatzke | G05B 19/41805 345/419 |
| 2010/0161095 A1* | 6/2010 | Lindgren | G06F 17/5095 700/98 |

OTHER PUBLICATIONS

Notification Concerning Transmittal of International Preliminary Report on Patentability in PCT/US2014/043450, dated Dec. 30, 2015; Title: Automatic Creation of Fasteners for Simulating a Computer-Aided Design (CAD) Model (9 pgs.).

Notification and Transmittal of the International Search Report and Written Opinion of the International Searching Authority for PCT/US2014/043450, dated Dec. 3, 2014; Title: Automatic Creation of Fasteners for Simulating a Computer-Aided Design (CAD) Model (11 pgs.).

Kockara, S., et al., "Contact Detection Algorithms," *Journal of Computers*, vol. 4 (10): 1053-1063 (Oct. 2009).

"Understanding Connectors" DS SolidWorks, (2009).

"Tutorial on the Basics of Bolted Joints," *Bolt Science Limited*, found at http://www.boltscience.com/pages/basics2.htm (1996-2013).

"Torque and Tension in Fasteners," *Machinery's Handbook 27th Edition*, p. 1495 (2004).

* cited by examiner

AUTOMATIC CREATION OF FASTENERS FOR SIMULATING A COMPUTER-AIDED DESIGN (CAD) MODEL

RELATED APPLICATION(S)

This application claims the benefit of U.S. Provisional Application No. 61/838,162, filed on Jun. 21, 2013. The entire teachings of the above application(s) are incorporated herein by reference.

BACKGROUND OF THE INVENTION

Computer-aided design (CAD) software allows a user to construct and manipulate complex three-dimensional (3D) models. A number of different modeling techniques can be used to create a 3D model. One such technique is a solid modeling technique, which provides for topological 3D models where the 3D model is a collection of interconnected topological entities (e.g., vertices, edges, and faces). The topological entities have corresponding supporting geometrical entities (e.g., points, trimmed curves, and trimmed surfaces). The trimmed surfaces correspond to the topological faces bounded by the edges. CAD systems may combine solid modeling and other modeling techniques, such as parametric modeling techniques. Parametric modeling techniques can be used to define various parameters for different features and components of a model, and to define relationships between those features and components based on relationships between the various parameters.

A design engineer is a typical user of a 3D CAD system. The design engineer designs physical and aesthetic aspects of 3D models, and is skilled in 3D modeling techniques. The design engineer creates parts and may assemble the parts into a subassembly or an assembly. A subassembly may also consist of other subassemblies. An assembly is designed using parts and subassemblies. Parts and subassemblies are hereinafter collectively referred to as components.

When designing an assembly, a design engineer may need to incorporate a standard part in a subassembly or an assembly model. Rather than re-designing a standard part, the part may be retrieved from a database of existing parts. Commercially available component databases contain CAD models for standard physical parts. Such databases are referred to as part libraries. Fully integrated with the SOLIDWORKS® 2013 software system available from Dassault Systèmes SolidWorks Corporation of Waltham, Mass. is the SOLIDWORKS Toolbox, which is an example of a commercially available part library. The SOLIDWORKS Toolbox includes standard parts such as common fasteners (e.g., bolts, screws, washers, and nuts), each of which geometrically represents a real-world fastener in a CAD model. The SOLIDWORKS Toolbox fasteners have spatial and mass property attributes that aid in the design of a real-world object.

In current state-of-the-art CAD systems, when the design engineer inserts a fastener into a CAD model, the design engineer may wish to establish a constraint to attach the fastener part to one or more other parts in the CAD model. Such constraints are referred to as mating relationships.

Current approaches to creating mating relationships include geometry-based solutions and predetermined mate-reference solutions. Geometry-based solutions allow a design engineer to select and drag, using a pointing device such as a mouse, or otherwise specify a particular geometry to be mated. The SmartMates tool, available in SOLIDWORKS software, provides for a geometry-based solution, which can determine that a circular edge on one component and a circular hole pattern on a second component have the same radius and then add a concentric mate to align the circular edge with the circular pattern.

Predetermined mate-reference solutions, such as is implemented in SOLIDWORKS® 2013 software, allow a design engineer to manually define a constrained relationship prior to a part being incorporated into a CAD model through selections and specifications of mates likely to be needed later. Thus, a design engineer may define how a part will be mated before the part is inserted into an assembly as a component of that assembly. Predetermined mate-references accelerate the mating process by not requiring the selection of entities while mating a component into an assembly. Once the definition is completed, components can be constrained automatically if certain conditions are met.

During the design process, an engineer may simulate the design of a model to analyze and evaluate the real-world performance of the product being designed. Such a simulation may be executed by an engineering simulation process, examples of which are SOLIDWORKS Simulation Xpress and SOLIDWORKS Simulation, which use the CAD model data to set up and execute simulation studies. Fasteners created during the design process are often excluded from simulation studies. Excluding the fasteners, in general, increases the execution speed of a simulation. However, a type of relationship in a modeling environment that includes a fastener differs from the type of relationship needed for a simulation study, as will be explained. The former relationship is typically a mating relationship based on geometric fit; whereas, the later relationship should, in many cases, be treated as a connection influencing the interaction between a fastener or fastener stack (which is a combination of two or more fasteners), and another part or one or more features thereof. Thus, in general, during a simulation of components, the design engineer manually substitutes fastener data used in a modeling environment with the appropriate fastener data for a simulation environment, which is a simulation-specific abstraction of the fastener that allows for the effect of fastening components together and the influence of a fastener on other components without the use of the fastener geometry.

For example, a threaded bolt fastener used in a simulation study is a mathematical representation of the influence of the threaded fastener on a CAD model. Without a simulation bolt fastener, a design engineer would have to make assumptions, which may be invalid, to simulate a threaded fastener between two components. If a mathematical representation of the fastener's influence is not available or if the design engineer wishes to use another representation, the design engineer could bond the two components that would be bolted together or include the fastener geometry in the simulation.

Bonding is an operation used in a simulation environment that ensures the continuity of a model to transfer loads between two entities. Using SOLIDWORKS Simulation software, an end-user may bond a face or an edge to any other face or edge, for example. Bonding the components may be highly inaccurate, however; for example, the simulation solver may consider two one-inch thick bonded plates as one two-inch thick plate, and stresses and displacements may be significantly different when two plates are bonded as opposed to bolted to one another.

Including the fastener geometry in the simulation may be prohibitive computationally and memory intensive for a very simple model (e.g., a difference between days of computational time versus minutes). In general, a design engineer may be required to expend considerable computational effort to include the actual fastener geometry in the simulation because more contact conditions need to be defined between the fastener and the mating components.

A CAD system that requires a design engineer to create two types of objects that represent the same part—one during the CAD modeling process and one to execute a simulation process lacks efficiencies that would be beneficial in a CAD modeling system.

Currently available technologies fall short of the solutions later to be described herein for various reasons. Such solutions allow for time-saving advantages and enhancements to current CAD systems, achieved by providing more efficient means for transferring data between a modeling environment and a simulation environment.

SUMMARY OF THE INVENTION

In general, in one aspect, embodiments of the invention feature a computer-implemented method of automatically providing data to a simulation process. The method involves analyzing a CAD model, searching for a first component that represents real-world object that is a fastener, and deriving information from the first component for use by the simulation process.

Other embodiments include a computer-aided design (CAD) system having a processor operatively coupled to a data storage system and a data storage memory operatively coupled to the processor. In such embodiments, the data storage system stores a three-dimensional model, and the data storage memory comprises instructions to configure the processor to analyze a CAD model, identify fastener parts, and derive data for use by a simulation process.

Yet other embodiments include a computer-readable data storage medium containing instructions for automatically analyzing data in a CAD model and deriving data for use by a simulation process. The modeling environment and the simulation environment can be seamless.

Other aspects of the invention include establishing that the first CAD component contacts a second CAD component representing a real-world object that is a not a fastener, calculating a zone of influence of the first CAD component on the second CAD component, and using the zone of influence in the simulation process. The invention may determine that the first CAD component is a fastener by (a) locating identifying data in an associated file or data structure, (b) analyzing faces in the first CAD component and recognizing a cylindrical face, (c) identifying a mating relationship between cylindrical components, where one of the cylindrical components is the first CAD component, and (d) enabling a user to interactively designate the first CAD component.

Further aspects of the invention include executing a search process to locate a non-fastener geometrical entity that is in contact with the first CAD component. The search process detects the non-fastener geometrical entity by utilizing a bounding box to reduce the number of contact candidates, identifying a co-axial geometry, identifying an axis direction, or analyzing a mating relationship. The bounding box surrounds the first CAD component to determine which ones of the contact candidates to consider as comprising non-fastener geometrical entity. Moreover, the invention may analyze one or more mating relationships to determine whether the first CAD component contacts the second CAD component.

Additionally, the geometry of the first CAD component may be displayed in the simulation environment to visually reflect the appearance of the first CAD component in the simulation environment. Furthermore a thread diameter, a thread pitch, a material type data, or combinations thereof may be properties that are derived and then used to calculate an axial preload for a threaded fastener during the simulation process.

The details of one or more embodiments of the invention are set forth in the accompanying drawings and the description that follows. Other features, objects, and advantages of the invention will be apparent from the description and drawings, and from the claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

Figure 1A:
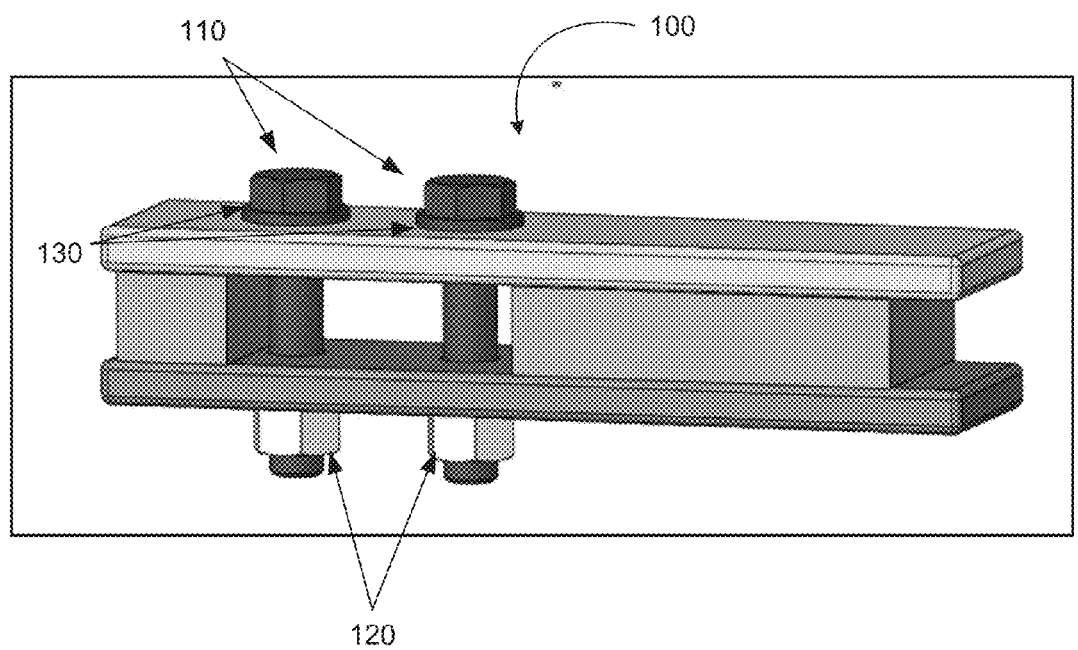
FIG. 1a is an illustration of a computer-aided design (CAD) model.

As previously described, design engineers may need to create different objects for the same component depending on whether the component is being used during a CAD modeling process or during a simulation process of a CAD model, which presents accuracy and efficiency issues. An example of this is a fastener that has real-world properties that affect other components during a simulation process, and where the real-world properties are not treated the same way during a modeling process, if at all. The solution described herein analyzes a geometric object constructed during a CAD modeling process as well as that object's geometric references (e.g., mating relationships) and then automatically creates an appropriate object with appropriate properties to be used by a simulation process.

The inventive concepts described herein frees a design engineer from having to delete an object and re-create a different representation of the object for use in a different environment, for example a simulation environment. In one example embodiment, this is achieved by analyzing a CAD model and re-using data that is appropriate for a simulation environment while not using data that is unnecessary for such an environment. The present invention need not delete the object; rather the object can be excluded from the CAD model during the simulation process thereby removing the influence of that object from the simulation study.

Fastener objects are representations of real-world fasteners such as, by way of non-limiting example, bolts, screws, nuts, sockets, rods, pins, springs, and washers. Herein, a connector refers to a fastener that fits through a hole in a non-fastener part or a part that is not a member of the same fastener stack; and an accessory part is a fastener that attaches to a connector; examples of accessory parts are CAD part models representing a nut or a washer that attach to a CAD part model of bolt connector. The connector and the accessory part (or parts) together are referred to as a fastener stack or simply a stack.

The present invention analyzes data that defines and locates a fastener object created in a CAD modeling environment and determines how to create an appropriate corresponding fastener object for a simulation process. Hereinafter, the appropriate corresponding simulation object will be referred to as the "substituted object." The fastener objects created in the modeling environment are then automatically excluded from the set of objects used by a simulation process; the substituted object is automatically used in the fastener object's place during the simulation process, and the design engineer need not intervene.

In the simulation environment, the substituted object is or nearly is the same size and in the same location, or nearly so, amongst other components as the initially modeled fastener. Visually, in the simulation environment, the fastener geometry may be displayed, and therefore, the fastener will appear the same (or nearly so) as in the modeling environment. For example, a substituted object in the simulation environment may be a visually transparent rendering of the geometry of the corresponding object in the modeling environment. Alternatively, the visual representation of the substituted object may differ from that in the modeling environment where the geometry of the fastener is displayed. Having the substituted object take on a different appearance than the initial fastener, visually indicates that an object has been substituted. (For example, see FIG. 1b.)

In addition to size and location, other properties in the initially modeled fastener become properties of the substituted object or are used to create suitable properties in the substituted object. By way of non-limiting example, if a material was defined for the initial fastener object, the same material may be used in the substituted object that becomes the simulation fastener and the material may be used to create other properties for the substituted object, which are then used to define the physical behavior and influence of the substituted object during a simulation. Other properties that an embodiment derives from a fastener are the diameter of the head of the fastener, the diameter of a nut if the fastener is a bolt, the diameter of any washers that contact the fastened geometry, and the thread diameter and the thread pitch of a threaded fastener. The thread diameter and the thread pitch of a threaded fastener along with the material properties of the fastener are used to calculate the axial preload.

In addition, the present invention calculates the fastener object's preload, tensile stress area (e.g., the minimum area of the threaded section of a bolt), and strength (e.g., in accordance with Machinery Handbook $27^{th}$ Edition, page 1495, Industrial Press, Inc., New York, N.Y. (2004), and includes this data in the substituted object.

Figure 1B:
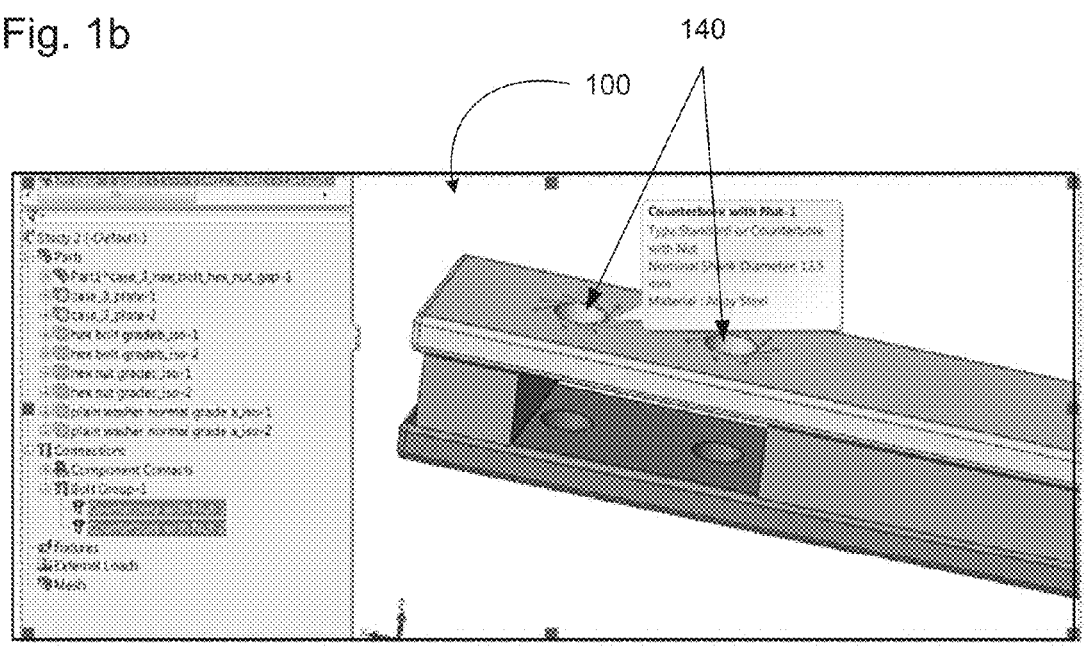
FIG. 1b is an illustration of the CAD model in FIG. 1a in a simulation environment.

Referring now to FIG. 1a, an illustration of a CAD model 100 having two bolt fasteners 110, two nut fasteners 120, and two washers 130 is shown. Each bolt-washer-nut set in FIG. 1a is a fastener stack. As described, a simulation connector differs from its counterpart in a modeling environment because a simulation connector has real-world properties that influence the behavior of other parts during a simulation study. For example, a bolt should bend during certain simulation studies; another connector may have spring-like qualities; whereas, a washer helps distribute a load. Therefore, when the model 100 is used in a simulation environment, the design engineer would typically delete the fasteners 110, 120, 130 and create simulation connectors 140 in their place, as shown in FIG. 1b. Having to replace the connectors may be time-consuming, challenging, and also prone to error because the design engineer may not replicate the properties of the bolt connector in the simulation environment with 100% accuracy.

Figure 2A:
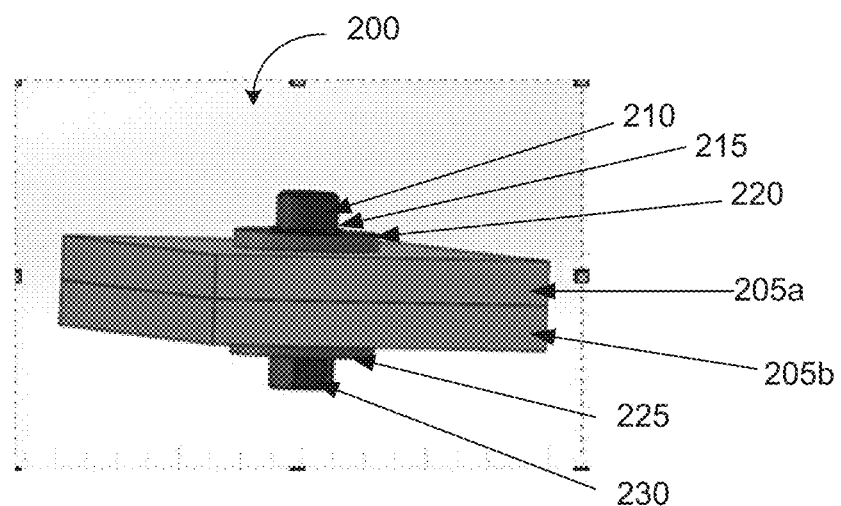
FIG. 2a and FIG. 2b illustrate a simple fastener stack.
Figure 2B:
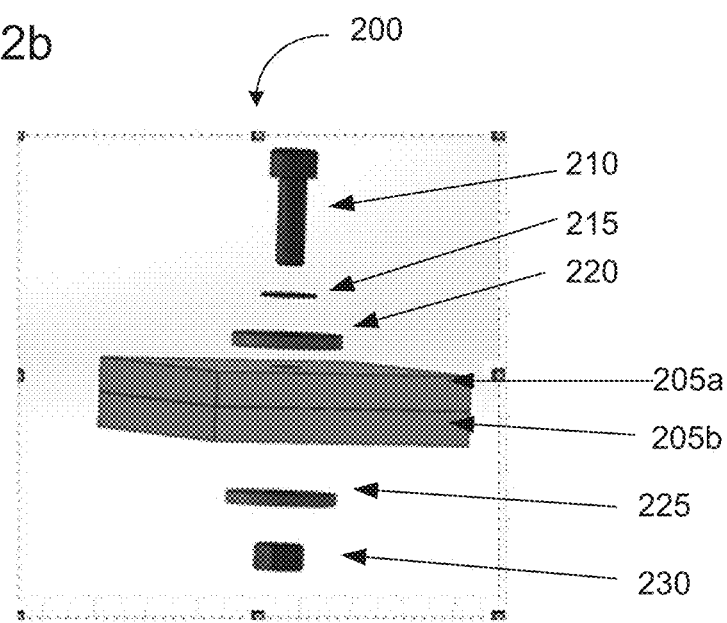

Referring now to FIGS. 2a and 2b, illustrations of a simple assembly 200 are shown in both a collapsed state and an exploded state, respectively. The two grey plates 205a and 205b are held together by a fastener stack that consists of (from top to bottom) a bolt 210, a lock washer 215, an upper large flat washer 220, a lower large flat washer 225 below the plates 205a and 205b, and a nut 230 also below the plates 205a and 205b.

The present invention first identifies which components are fastener components and which components are not. In FIGS. 2a and 2b, the plate components 205a, and 205b are not fasteners, whereas the other components 210-230 are fastener components. Fastener components may be identified in various ways, including (1) by data that identifies the fastener as such in a part file, (2) by analyzing faces in a part and recognizing a cylindrical face, and/or (3) by identifying two cylindrical parts having a mating relationship (e.g., a concentric mating relationship). Additionally, an embodiment of the present invention may indicate which parts were identified as fastener parts (e.g., via highlighting or presenting a list to the design engineer of the fastener parts), and allow the design engineer to indicate otherwise by interactively selecting parts to add or remove from the set of fasteners identified automatically.

Fastener parts are often standard components and may be downloaded from an on-line component database, such as one accessible via the 3D ContentCentral® service available from Dassault Systemes SolidWorks Corporation or an on-line database available from a vendor of the respective physical hardware components. Furthermore, as previously mentioned the SOLIDWORKS Toolbox includes standard components accessible to SOLIDWORKS end-users. Additionally, a design engineer may have access to a custom library of standard components available within his or her enterprise. These standard fastener components may be readily identifiable by locating identifying data in a file having a format that an embodiment of the present invention can read.

After identifying fastener components, the present invention analyzes the fastener components 210-230 and determines which components contact the plate components 205a and 205b. In FIG. 2a, the top gray plate 205a is contacted by the upper large flat washer 220 and the bottom gray plate 205b is contacted by the lower large flat washer 225. Contact may be determined by analyzing mating relationships and/or by a simple or a more complex contact detection process (e.g., a process that detects when geometry from one part touches or is within a certain distance to another part). Moreover, mating information is one technique that may be utilized to narrow down the scope and hence increase the speed of the contact detection process.

The present invention executes a geometry search process to locate non-fastener geometry in contact with each fastener (e.g., to find hole-cylinder pairs). To narrow the search, in an embodiment, a bounding box surrounding the respective fastener is utilized to ignore geometry that does not fall within the bounding box. Other methods that may be used to detect non-fastener geometry in contact with each fastener include methods that identify co-axial components, components having the same axis direction, components having the same or nearly the same radius, a cylinder having the same or nearly the same dimension(s) as a fastener, or a combination thereof. Additionally, the detection of mating relationships during the search process may be used to identify non-fastener geometry in contact with the fasteners. Narrowing the search to likely contacts by employing the bounding box technique, analyzing mating relationships, and other methods as described, helps improve the computational performance of the present invention while finding the contacts. After likely contacts are identified, a contact-detection method, such as those known by those skilled in the art, may be employed by the present invention to detect actual contacts.

After identifying which fasteners contact non-fastener components, the present invention determines the diameter of each contacting fastener. The diameter may be determined by analyzing the fastener's part file or data structure stored in memory to locate dimension data or by calculating the number of geometric units across the fastener. For example, the diameter of the contacting fastener may be specified as a parameter within a part file with a specific parameter name that indicates the value is the diameter. Furthermore, to obtain the sizing data, the present invention may read that data directly from the fastener part file.

Figure 3:
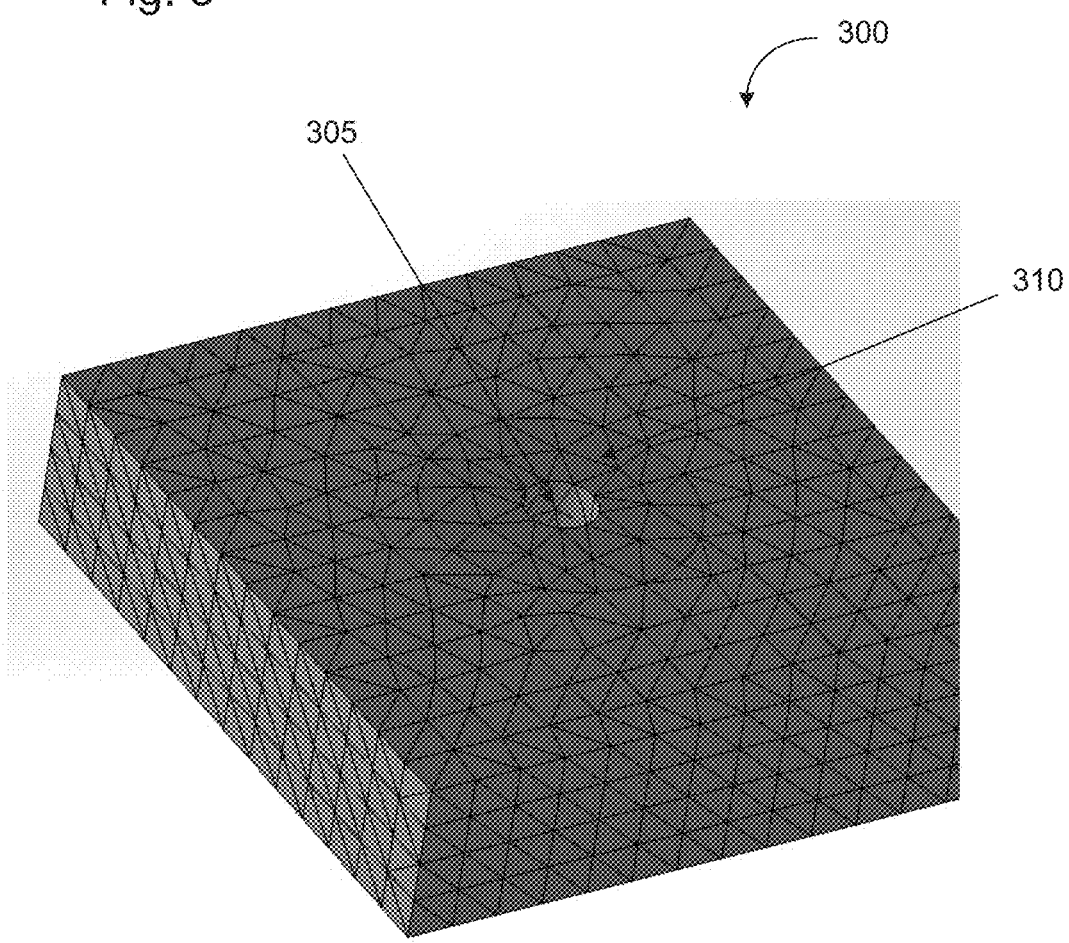
FIG. 3 is an illustration of a meshed simulation model, according to an example embodiment of the present invention.

FIG. 3 shows an image of a mesh 300 of the model of the two grey plates 205a and 205b held together by a fastener stack illustrated in FIG. 2a and FIG. 2b. In FIG. 3, the simulation bolt connectors are hidden, as is shown by an exposed hole 305 located where a fastener would be. An influence radius 310 (depicted as a red circular area) in the mesh shows the influence of, as illustrated in FIGS. 2a and 2b, the fastener stack 210-230 upon the grey plates 205a, 205b through the upper large flat washer 220. The unseen simulation bolt connectors press on the grey area, the area of pressure depicted in red. (As will be described, data gathered in FIG. 4, step 430 is used to calculate the zone of the influence of a simulation connector in a simulation study.)

In the example shown in FIG. 3, the influence radius 310 (which may also be referred to as a zone of influence), includes an area where the washer 220 touches plate 205a, whereas, the preload data and stiffness data is derived from bolt 210. If the washer 220 were not present, the influence radius, the preload data, and the stiffness data would all be derived from bolt 210. All the nodes (i.e., the points in the mesh) in the influence radius 310 are considered when a contact or connection condition is created, which depends on the fastener type, and can be used to calculate load transfer parameters in various simulation studies. The influence radius 310 will have a force applied equal to the axial preload of the fastener distributed over the influence radius 310. The force applied is from the mathematical center of the simulation connector to the nodes of the non-fastener component using rigid bars. Thus, the connection between each node pair is simulated as a rigid bar. The cylinder (i.e., the connector shaft depicted as hole 305) is simulated as a beam element (i.e., one line with two endpoints). The connector material properties are used to calculate a default value for the axial preload of the connector for the simulation study. However, the design engineer can always modify the load value after the simulation connector is automatically created.

Figure 4:
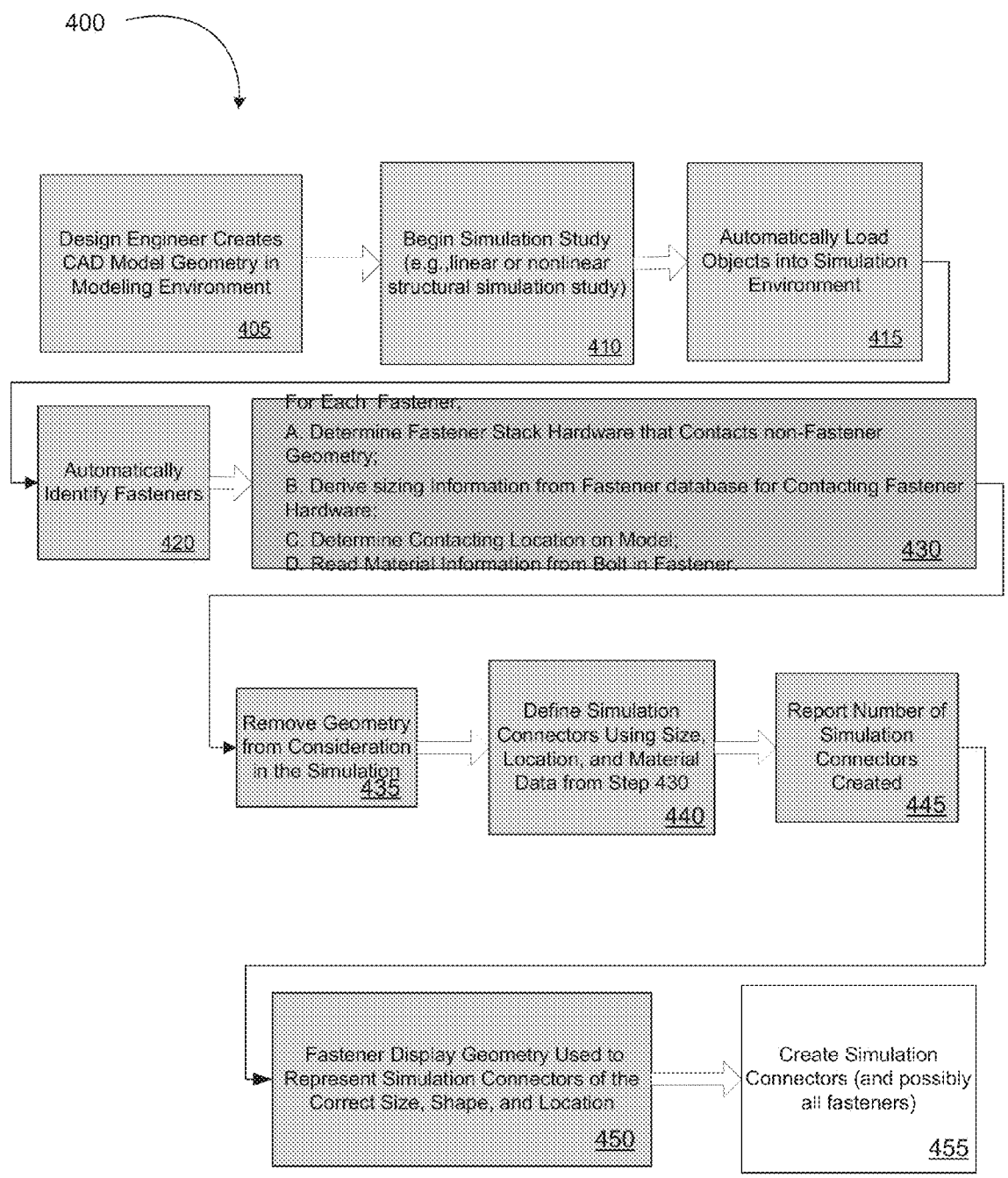
FIG. 4 is a flow diagram containing steps for automatically creating simulation connectors, according to an example embodiment of the present invention.

Referring now to FIG. 4, a process 400 for automatically converting a fastener object in a modeling environment to a substituted object in a simulation environment is shown, according to an example embodiment of the present invention. To begin, a design engineer creates a CAD model in a modeling environment (step 405). The CAD model is comprised of geometry that helps define various components. The design engineer then sets up a simulation study, such as a linear or nonlinear (static or dynamic) simulation study (step 410). Other simulation studies that may be constructed and conducted on CAD models are static, buckling, frequency, harmonic, random, vibration, modal time history, thermal, response spectrum, drop test, fatigue, and design studies. In the next step modeling program objects (having geometry data, etc.) of all components from the modeling environment are loaded into the simulation environment except for those objects defining the fasteners (step 415); however, in some embodiments the objects may not need to be loaded (e.g., input to or read by a different computing process); rather, the modeling and simulation environments may be seamless and the objects are present in and transparent with respect to both environments.

For the fasteners in the modeling environment, instead of the design engineer separately specifying the fastener and its geometry in the simulation environment as in the prior art, the corresponding simulation fasteners are automatically identified (step 420) using various methods as has been discussed. For example, a fastener may be identified after process 400 reads and interprets a code in the header of a part data file defining a fastener as such. Additionally or alternatively, when fasteners are created in the modeling environment, the identity data (ID) of each fastener may be added to a list of fastener IDs readily available in the simulation environment. That readily available list is then read by process 400 to automatically identify fasteners in the simulation environment. Moreover, a fastener may be identified by process 400 determining that the part has a cylindrical face. Furthermore, process 400 can identify a fastener by the type of mating relationship between two parts (e.g., a concentric mate relationship between two cylindrical features). An embodiment also allows the design engineer to particularly point out which components are fasteners. Identifying fasteners also includes identifying each fastener stack and the fastener parts in that stack. Process 400 can accomplish this by analyzing mating relationships between fasteners, the proximity of fasteners with respect to each other, or a combination thereof, by way of non-limiting example.

In the next step, for each fastener, (a) a part in the fastener stack that contacts non-fastener geometry is determined (e.g., see upper large flat washer 220 in FIGS. 2a and 2b), as has been previous discussed, (b) the sizing information for the contacting fastener part is determined (e.g., by reading a fastener database), (c) the location(s) where the contacting fastener part meets non-fastener geometry is determined (e.g., by analyzing co-planar faces, axes, etc., by executing a contact detection process as previously discussed, or by determining the influence zone as previously discussed), and (d) data about the fastener material is determined (e.g., by reading data specifying the real-world material from the part file) (step 430). The information described in (a), (b), and (c) is then used to calculate the zone of influence of the simulation connector (e.g., influence radius for a circular fastener) in the simulation study. Note that in an embodiment, an area of a circle that circumscribes the fastener is projected onto the non-fastener part to calculate the zone of influence. The information regarding fastener material described in (d) is used to calculate the preload, that is, the force that holds a joint together; see Machinery Handbook 27th Edition, page 1495, Industrial Press, Inc., New York, N.Y. (2004).

In some embodiments, if the geometry of a fastener was included in the simulation model, the geometry is removed from consideration during the simulation (step 435). And, once all the fasteners are identified and the foregoing information about the fasteners collected, the simulation connectors are created using size, location, and material data previously retrieved (step 440). Further, an embodiment may report the number of simulation connectors created (step 445).

In addition, using properties of the fastener, the preload force and/or preload path may be calculated (e.g., see Machinery's Handbook, 27th Edition). These may be used in the simulation study to define tension (e.g., when the connector is tight), which may then be used as input to the simulation process.

As previously discussed, embodiments may also during a simulation study use the geometry of a fastener that was created in the modeling environment for display purposes only, thereby representing the correct size, location, and shape of the fastener (step 450). This is in contrast to the representation of the simulation connectors 140 shown in FIG. 1*b*.

After the material, location, and preload data are determined, the simulation connector is created (step 455). A bolt connector may be defined as one or more rigid bars with a spring, for example. In an embodiment, a beam element represents a bolt shank and rigid bar elements connect the beam to the flanges. The bolt preload may be calculated using thermal expansion/contraction. (For a method that calculates thermal expansion/contraction, see 'Technical Note: Modeling Pretensions in Bolted Connections', J. M. Stallings and D. Y. Hwang, Computers & Structures, Vol. 45, No. 4, pp 801-803, 1992.)

A bolt connector may be defined by a beam element, which does not have any resistance to torque because axial rotational degree of freedom is released and is consistent with the real-world connector. In reality, the slippage between the connecting parts is resisted by the frictional force provided by the clamp force (preload).

Figure 5:
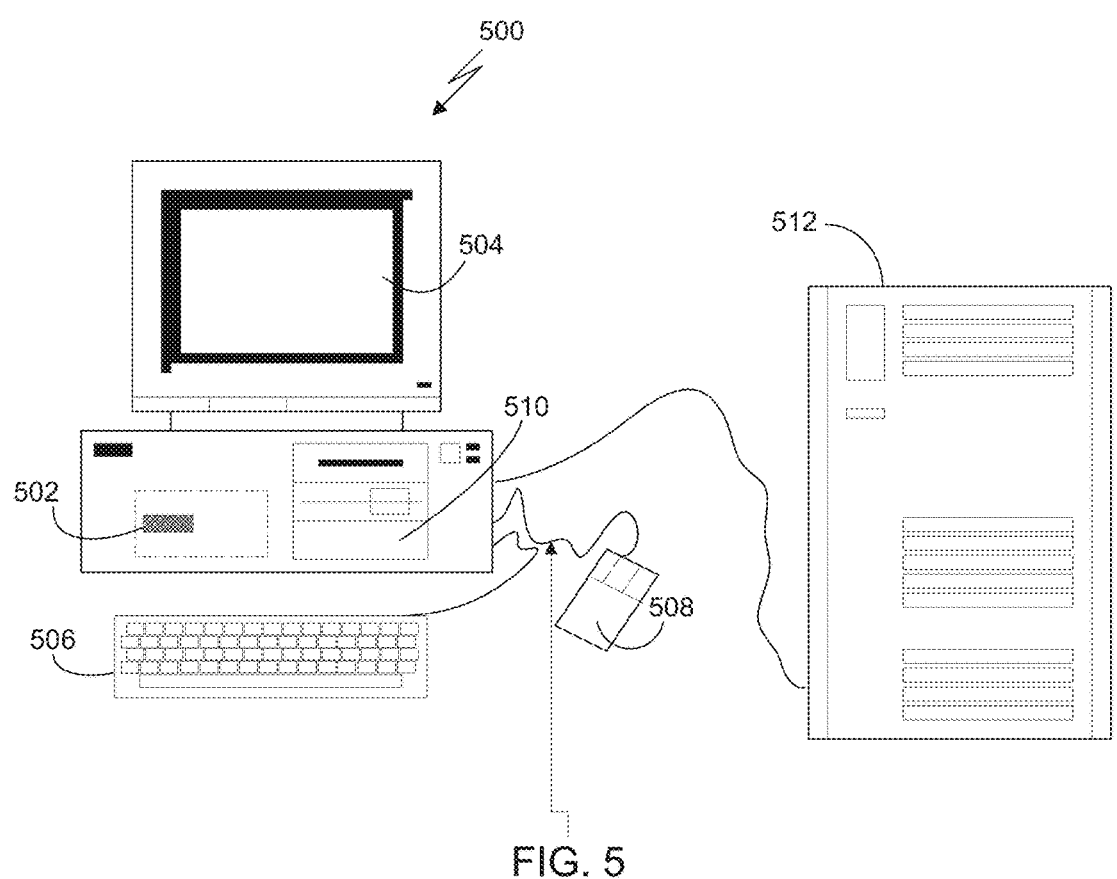
FIG. 5 is a schematic diagram of a computer system in which embodiments of the present invention may be implemented.

FIG. 5 illustrates a computerized modeling system 500 that includes a CPU 502, a computer monitor 504, a keyboard input device 506, a mouse input device 508, and a storage device 510. The CPU 502, computer monitor 504, keyboard 506, mouse 508, and storage device 510 can include commonly available computer hardware devices. For example, the CPU 502 can include an Intel-based processor. The mouse 508 may have conventional left and right buttons that the design engineer may press to issue a command to a software program being executed by the CPU 502. As an alternative or in addition to the mouse 508, the computerized modeling system 500 can include a pointing device such as a trackball, touch-sensitive pad, or pointing device and buttons built into the keyboard 506. Those of ordinary skill in the art appreciate that the same results described herein with reference to a mouse device can be achieved using another available pointing device. Other appropriate computer hardware platforms are suitable as will become apparent from the discussion that follows. Such computer hardware platforms are preferably capable of operating the Microsoft Windows® 7, UNIX, Linux, or MAC OS operating systems.

Additional computer processing units and hardware devices (e.g., rapid prototyping, video, and printer devices) may be included in the computerized modeling system 500. Furthermore, the computerized modeling system 500 may include network hardware and software thereby enabling communication to a hardware platform 512, and facilitating communication between numerous computer systems that include a CPU and a storage system, among other computer components.

Computer-aided modeling software (e.g., processes 400) may be stored on the storage device 510 and loaded into and executed by the CPU 502. The modeling software allows a design engineer to create and modify a 3D model and implements aspects of the invention described herein. The CPU 502 uses the computer monitor 504 to display a 3D model and other aspects thereof as described. Using the keyboard 506 and the mouse 508, the design engineer can enter and modify data associated with the 3D model. The CPU 502 accepts and processes input from the keyboard 506 and mouse 508. The CPU 502 processes the input along with the data associated with the 3D model and makes corresponding and appropriate changes to that which is displayed on the computer monitor 504 as commanded by the modeling software. In one embodiment, the modeling software is based on a solid modeling system that may be used to construct a 3D model consisting of one or more solid and surface bodies.

Embodiments of the invention may be implemented in digital electronic circuitry, or in computer hardware, firmware, software, or in combinations thereof. Apparatuses may be implemented in a computer program product tangibly embodied in a machine-readable storage device for execution by a programmable processor; and method steps may be performed by a programmable processor executing a program of instructions to perform functions by operating on input data and generating output. Embodiments of the invention may advantageously be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; in any case, the language may be a compiled or interpreted language. Suitable processors include, by way of non-limiting example, both general and special purpose microprocessors. Generally, a processor will receive instructions and data from a read-only memory and/or a random access memory and in some embodiments instructions and data may be downloaded through a global network. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, custom-designed ASICs (application-specific integrated circuits).

Embodiments of the present invention or aspects thereof described herein may be implemented in the form of hardware, firmware, or software. If implemented in software the software may be stored on any non-transient computer readable medium that is configured to enable a processor to load the software or subsets of instructions thereof. The processor then executes the instructions and is configured to operate or cause an apparatus to operate in a manner as described herein.

The embodiments disclosed herein allow part models of fasteners to be easily re-purposed as fasteners for use by a simulation study. This frees a design engineer from having to delete fasteners created in a modeling environment and re-create the same fastener with data needed by a simulation process to simulate the real-world behavior of a subassembly or an assembly. An advantage of the embodiments disclosed herein is that what use to take much time and effort by a design engineer can now be accomplished with just one click of a mouse button that selects a user interface item to begin a simulation process; the amount of time and effort is reduced because the present invention automatically creates simulation fasteners from the fasteners used in the modeling environment. Moreover, automatically creating simulation fasteners from part models reduces the chance that a design engineer may not replicate the properties of a fastener or fastener stack with 100% accuracy in a simulation environment (e.g., a missing nut or washer, or an inaccurate thread number can affect the simulation results). A further advantage is that the design engineer needs to no longer make assumptions that may be false when creating simulation fasteners (e.g., a size or a default value for preload data). A manual process required by prior art sometimes required advanced simulation knowledge for which not all design engineers are trained. Yet another advantage is that the present invention need not represent the simulation connector abstractly as does the prior art and thereby impede the design engineer from identifying a simulation connector of one sized from that of another and requiring intensive investigation by the design engineer to understand the size of the simulation bolt connector.

A number of embodiments of the present invention have been described. Nevertheless, it will be understood that various modifications may be made without departing from the spirit and scope of the invention. For example, embodiments of the present invention may change the order in which operations are performed, such as, step 420 in FIG. 4 may be implemented before step 410 in FIG. 4. Furthermore, depending on the needs of an implementation, particular operations described herein may be implemented as a combined operation (e.g., steps 415 and 420 in process 400), eliminated (step 420 in process 400 is not necessary if the fasteners were identified prior to step 415 and not loaded into the simulation environment), added to, or otherwise rearranged (e.g., steps 450 and 455 in process 400).

What is claimed is:

1. A computer-implemented method of simulating computer-aided design models using a computer-aided simulation process, the method comprising:
    obtaining a computer-aided design (CAD) model;
    from the obtained CAD model, automatically creating fastener data useable by the computer-aided simulation process upon initiation of the computer-aided simulation process by a user interface command selection, said creating fastener data including a processor automatically:
    (i) determining that a first computer-aided design (CAD) component of the CAD model created in a CAD modeling environment represents a real-world fastener;
    (ii) analyzing the first CAD component and deriving one or more properties for use by the computer-aided simulation process, wherein the derived properties include one or more of: size data, location data, material type data, a thread diameter, and a thread pitch;
    (iii) establishing that the first CAD component contacts a second CAD component, wherein the second CAD component represents a real-world object that is a non-fastener object, the establishing includes executing a search process that locates a non-fastener geometrical entity in contact with the first CAD component in the CAD model, the locating includes detecting locations where the first CAD component contacts the non-fastener geometrical entity; and
    (iv) calculating a zone of influence of the first CAD component on the second CAD component, the calculating includes determining (a) an influence the first CAD component has on the second CAD component, and (b) the influence distributed over an area that includes the detected locations where the first CAD component contacts the second CAD component; and
    using the one or more derived properties and the calculated zone of influence in a manner that replaces the first CAD component constructed in the CAD modeling environment with a simulation fastener in the computer-aided simulation process,
    wherein the computer-aided simulation process applies the simulation fastener to a simulation of a real-world assembly or subassembly.

2. The computer-implemented method of claim 1, wherein the step of (i) determining comprises one of: (a) locating fastener identifying data in one of a file associated with the first CAD component and a data structure associated with the first CAD component, (b) analyzing faces in the first CAD component and recognizing a cylindrical face, (c) identifying a mating relationship between a plurality of cylindrical components, wherein one of the plurality of cylindrical components is the first CAD component, and (d) enabling a user to interactively designate the first CAD component.

3. The computer-implemented method of claim 1, wherein the search process detects the non-fastener geometrical entity by at least one of: utilizing a bounding box to reduce a number of contact candidates, identifying a co-axial geometry, identifying an axis direction, and analyzing a mating relationship.

4. The computer-implemented method of claim 3, wherein a bounding box surrounding the first CAD component determines which ones of the number of contact candidates to consider as comprising the non-fastener geometrical entity.

5. The computer-implemented method of claim 1, wherein the step of (iii) establishing analyzes one or more mating relationships to determine whether the first CAD component contacts the second CAD component.

6. The computer-implemented method of claim 1, further comprising displaying the geometry of the first CAD component during the computer-aided simulation process to visually reflect the appearance of the first CAD component during the computer-aided simulation process.

7. The computer-implemented method of claim 1, wherein one or more of the thread diameter, the thread pitch, and the material type data are used to calculate an axial preload for a threaded fastener during the computer-aided simulation process.

8. The computer-implemented method of claim 1, wherein calculating the zone of influence comprises using the size data and location data to project an area that circumscribes the first CAD component onto the second CAD component.

9. A computer-aided design system comprising:
a processor operatively coupled to a data storage system, the data storage system storing a three-dimensional model; and
a data storage memory operatively coupled to the processor and comprising instructions to configure the processor to:
obtain a computer-aided design (CAD) model from the data storage system;
from the obtained CAD model, automatically create fastener data useable by a computer-aided simulation process upon initiation of the computer-aided simulation process by a user interface command selection, said creating fastener data including the processor automatically:
   determining that one or more computer-aided design (CAD) parts in the obtained CAD model are fasteners parts, wherein each fastener part represents a real-world fastener; and
   analyzing the determined fastener parts and deriving a plurality of properties of the fastener parts from data relating to the respective fastener parts;
   identifying a contacted CAD part by executing a search process that locates a geometrical entity in contact with one of the determined fastener parts, the locating includes detecting locations where the one determined fastener part contacts the non-fastener geometrical entity;
   calculating a zone of influence of the one determined fastener part on the contacted CAD part, the calculating includes determining (a) an influence the one determined fastener part has on the contacted CAD part, and (b) the influence distributed over an area that includes the detected locations where the one determined fastener part contacts the contacted CAD part;
initiate the computer-aided simulation process, wherein the one determined fastener part is automatically excluded from the computer-aided simulation process, the processor instead using the derived plurality of properties of the one determined fastener part and the calculated zone of influence, and automatically creating one simulation fastener as a substitute for the one determined fastener part for use by the computer-aided simulation process,
the one simulation fastener being comprised of one or more of the derived plurality of properties in a manner that replaces in the computer-aided simulation process the one determined fastener part constructed during a modeling process,
wherein the computer-aided simulation process applies the one simulation fastener to a simulation of a real-world assembly or subassembly.

10. The computer-aided design system of claim 9, wherein one or more of the derived plurality of properties aid in the calculation of the zone of influence of the one simulation fastener during the computer-aided simulation process.

11. The computer-aided design system of claim 9, wherein the derived plurality of properties comprise data indicating one or more of: a size, a location, a material type, a thread diameter, and a thread pitch.

12. The computer-aided design system of claim 9, wherein determining that at least one of the CAD parts is fastener parts comprises, for each CAD part, one of: (a) locating fastener identifying data in one of a file associated with the CAD part and a data structure associated with the CAD part, (b) analyzing faces in the CAD part and recognizing a cylindrical face, (c) identifying a mating relationship between a plurality of cylindrical components, wherein one of the plurality of cylindrical components is the CAD part, and (d) enabling a user to interactively designate the CAD part as a fastener part.

13. The computer-aided design system of claim 9, wherein the search process detects the geometrical entity by at least one of: utilizing a bounding box to reduce an amount of a plurality of contact candidates, identifying a co-axial geometry, identifying an axis direction, and analyzing a mating relationship.

14. The computer-aided design system of claim 13, wherein the bounding box surrounding the one of the determined fastener parts determines which ones of the plurality of contact candidates comprised the geometrical entity.

15. The computer-aided design system of claim 13, wherein one or more mating relationships are analyzed to determine whether the geometrical entity contacts the one of the determined fastener parts.

16. A non-transitory computer-readable data storage medium comprising:
instructions embodying a computer-aided design system, the instructions causing a computer to:
a. from a subject computer-aided design (CAD) model, automatically create fastener data useable by a computer-aided simulation process by upon initiation of the computer-aided simulation process by a user interface command selection automatically:
   (i) determining that a first computer-aided design (CAD) component of the CAD model created in a CAD modeling environment represents a real-world fastener;
   (ii) analyzing the first CAD component and deriving one or more properties for use by the computer-aided simulation process, wherein the derived properties include one or more of: size data, location data, material type data, the thread diameter, and the thread pitch;
   (iii) establishing that the first CAD component contacts a second CAD component in the CAD model, wherein the second CAD component represents a real-world object that is a non-fastener object, the establishing includes executing a search process that locates a non-fastener geometrical entity in contact with the first CAD component, the locating includes detecting locations where the first CAD component contacts the non-fastener geometrical entity; and
   (iv) calculating a zone of influence of the first CAD component on the second CAD component, the calculating includes determining (a) an influence the first CAD component has on the second CAD component, and (b) the influence distributed over an area that includes the detected locations where the first CAD component contacts the second CAD component; and
b. automatically use the one or more derived properties and the calculated zone of influence in a manner that replaces the first CAD component constructed during a CAD modeling process in the computer-aided simulation process,
wherein the computer-aided simulation process applies the simulation fastener to a simulation of a real-world assembly or subassembly.

17. The non-transitory computer-readable data storage medium of claim 16, wherein to determine that the first CAD component represents the real-world fastener comprises one of: (a) locating fastener identifying data in one of a file associated with the first CAD component and a data structure associated with the first CAD component, (b) analyzing faces in the first CAD component and recognizing a cylindrical face, (c) identifying a mating relationship between a plurality of cylindrical components, wherein one of the plurality of cylindrical components is the first CAD component, and (d) enabling a user to interactively designate the first CAD component.

18. The non-transitory computer-readable data storage medium of claim 16, wherein the search process detects the non-fastener geometrical entity by at least one of utilizing a bounding box to reduce an amount of a plurality of contact candidates, identifying a co-axial geometry, identifying an axis direction, and analyzing a mating relationship.

19. The non-transitory computer-readable data storage medium of claim 18, further comprising instructions causing a computer to surround the first CAD component with the bounding box for determining which ones of the plurality of contact candidates to consider as comprising the non-fastener geometrical entity.

20. The non-transitory computer-readable data storage medium of claim 16, further comprising instructions causing a computer to analyze one or more mating relationships to determine whether the first CAD component contacts the second CAD component.

* * * * *